United States Patent
Wang

(10) Patent No.: US 11,817,828 B2
(45) Date of Patent: Nov. 14, 2023

(54) AMPLIFIER CIRCUITRY AND VOLTAGE CORRECTION CIRCUITRY

(71) Applicants: Kabushiki Kaisha Toshiba, Tokyo (JP); Toshiba Electronic Devices & Storage Corporation, Tokyo (JP)

(72) Inventor: Tong Wang, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 504 days.

(21) Appl. No.: 17/012,631

(22) Filed: Sep. 4, 2020

(65) Prior Publication Data

US 2021/0257975 A1 Aug. 19, 2021

(30) Foreign Application Priority Data

Feb. 14, 2020 (JP) ................... 2020-023352

(51) Int. Cl.
*H03F 1/56* (2006.01)
*H03F 3/19* (2006.01)
*H03K 5/24* (2006.01)

(52) U.S. Cl.
CPC ............ *H03F 1/56* (2013.01); *H03F 3/19* (2013.01); *H03K 5/24* (2013.01); *H03F 2200/387* (2013.01); *H03F 2200/451* (2013.01)

(58) Field of Classification Search
CPC ........ H03F 1/56; H03F 3/19; H03F 2200/387; H03F 2200/451; H03F 2200/09; H03F 2200/541; H03F 1/0272; H03F 3/26; H03F 3/245; H03F 3/72; H03F 3/45; H03F 1/3211; H03F 3/20; H03F 3/68; H03K 5/24

See application file for complete search history.

(56) References Cited

U.S. PATENT DOCUMENTS

| | | | |
|---|---|---|---|
| 7,170,353 B2 | 1/2007 | Amano | |
| 8,134,408 B2 | 3/2012 | Kawakami et al. | |
| 8,314,658 B2 | 11/2012 | Kawakami et al. | |
| 9,203,364 B2 | 12/2015 | Abe et al. | |
| 2009/0067545 A1* | 3/2009 | Chu | H03F 3/45475 330/258 |

FOREIGN PATENT DOCUMENTS

| | | |
|---|---|---|
| JP | 2005-143089 A | 6/2005 |
| JP | 2011-66599 A | 3/2011 |
| JP | 5168495 B2 | 3/2013 |
| JP | 2015-144427 A | 8/2015 |

* cited by examiner

*Primary Examiner* — Jung Kim
(74) *Attorney, Agent, or Firm* — Allen & Overy LLP

(57) ABSTRACT

An amplifier circuitry includes a first amplifier, a second amplifier, a voltage generating circuitry, and a control circuitry. The first amplifier circuitry configured to amplify a first signal. The second amplifier circuitry configured to amplify a second signal which forms differential signals together with the first signal. The voltage generating circuitry configured to generate at least one of a first bias voltage to be applied to the first signal and a second bias voltage to be applied to the second signal. The control circuitry configured to control the voltage generation circuitry so as to decrease a difference between a DC component of an output of the first amplifier circuitry and a DC component of an output of the second amplifier circuitry.

4 Claims, 4 Drawing Sheets

AMPLIFIER CIRCUITRY AND VOLTAGE CORRECTION CIRCUITRY

CROSS REFERENCE TO RELATED APPLICATIONS

This application is based upon and claims the benefit of priority from the prior Japanese Patent Application No. 2020-023352, filed on Feb. 14, 2020, the entire contents of which are incorporated herein by reference.

FIELD

Embodiments of the present invention relate to an amplifier circuitry and a voltage correction circuitry.

BACKGROUND

In a pseudo differential type power amplifier, an even number-order distortion generated in each single-phase circuitry is ideally canceled at an output. However, it is generally difficult to remove a mismatch in the single-phase circuitries which amplify differential input signals, and this mismatch causes the even number-order distortion of an output signal.

DETAILED DESCRIPTION OF THE INVENTION

According to one embodiment, an amplifier circuitry includes a first amplifier, a second amplifier, a voltage generating circuitry, and a control circuitry. The first amplifier circuitry configured to amplify a first signal. The second amplifier circuitry configured to amplify a second signal which forms differential signals together with the first signal. The voltage generating circuitry configured to generate at least one of a first bias voltage to be applied to the first signal and a second bias voltage to be applied to the second signal. The control circuitry configured to control the voltage generation circuitry so as to decrease a difference between a DC component of an output of the first amplifier circuitry and a DC component of an output of the second amplifier circuitry.

Embodiments will now be explained with reference to the drawings.

Figure 1:
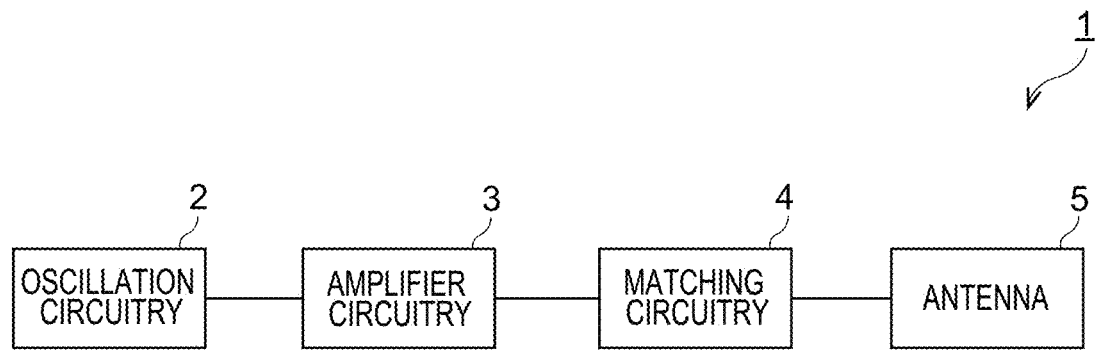
FIG. 1 is a diagram illustrating the outline of a transmitter according to an embodiment.

FIG. 1 is a block diagram illustrating an example of a transmitter for a signal according to an embodiment. A transmitter 1 includes, for example, an oscillation circuitry 2, an amplifier circuitry 3, a matching circuitry 4, and an antenna 5. The transmitter 1 converts, for example, a generated signal into a radio wave, and outputs the radio wave to an external part. The signal may be subjected to encoding, modulation and so on by various methods in the transmitter 1.

The oscillation circuitry 2 is a circuitry which oscillates a signal. The oscillation circuitry 2 oscillates, for example, a clock signal, and appropriately converts data to a signal such as voltage or current and outputs the signal.

The amplifier circuitry 3 amplifies the signal output from the oscillation circuitry 2 and outputs the amplified signal. Into the amplifier circuitry 3, for example, differential signals are input, and the amplifier circuitry 3 amplifies the differential signals and then combines the amplified differential signals. The amplifier circuitry 3 outputs the combined signal to the matching circuitry 4.

The matching circuitry 4 is a circuitry which performs impedance matching. Specifically, the matching circuitry 4 performs impedance matching on the signal output from the amplifier circuitry 3 and outputs the resulting signal. Note that though the amplifier circuitry 3 will be explained as including a balun in the following, the balun may be excluded from the amplifier circuitry 3 and included as a part of the matching circuitry 4.

The antenna 5 coverts the signal output from the matching circuitry 4 to a radio wave, and outputs the radio wave. The antenna 5 outputs, for example, a radio wave containing a content generated by the oscillation circuitry 2.

Figure 2:
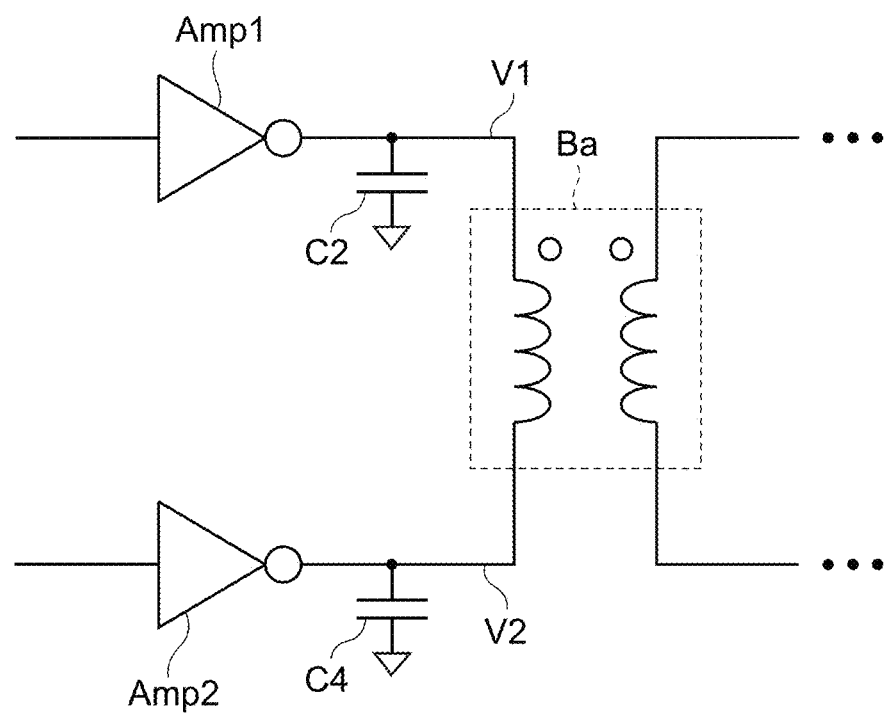
FIG. 2 is a diagram illustrating a combiner of signals in amplification using differential signals.

FIG. 2 is a diagram illustrating a simple example of the amplifier circuitry 3 which amplifies and combines the differential signals. FIG. 2 is exemplified as an example for illustrating the effect of this embodiment. The amplifier circuitry which amplifies the differential signals as illustrated in FIG. 2 includes, for example, a first amplifier circuitry Amp1 which amplifies a first signal that is one signal of the differential signals and a second amplifier circuitry Amp2 which amplifies a second signal that is the other signal. Capacitors C2, C4 are capacitors for matching which cancel the inductance of a balun Ba, and may be omitted depending on the performance of the balun Ba.

An output of the first amplifier circuitry Amp1 and an output of the second amplifier circuitry Amp2 are combined, for example, in a differential inductor included in the balun Ba, converted by the other inductor in the balun Ba into a single-phase signal, and output to the matching circuitry.

Note that a midpoint between the differential inductors is a virtual ground node, and therefore does not affect the differential outputs even if a parasitic capacitance is added. Therefore, even when a voltage extraction circuitry is coupled to the midpoint between the differential inductors, the amplification factor does not deteriorate.

Figure 3:
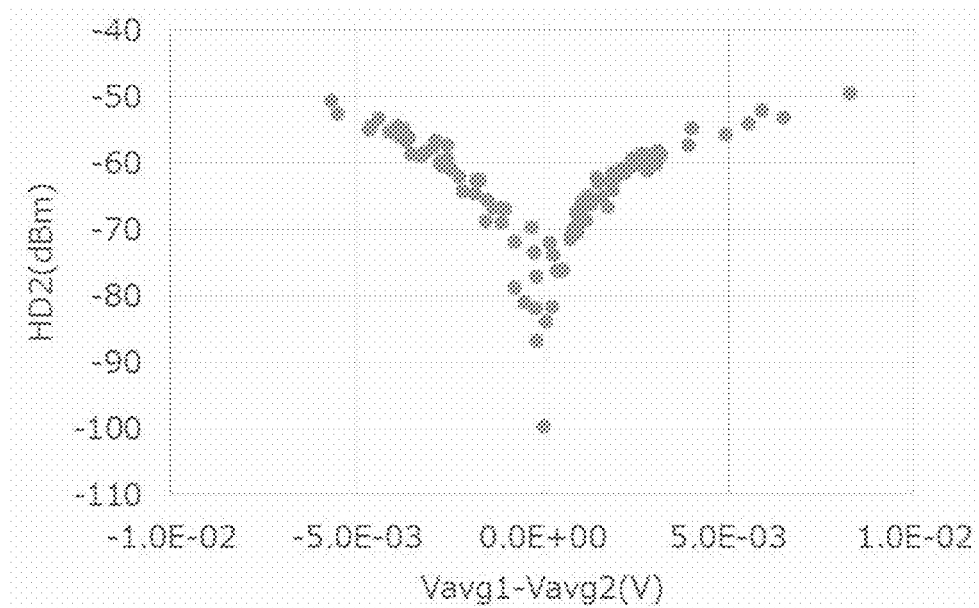
FIG. 3 is a chart illustrating a relation between DC components of the differential signals and a strength of a second-order distortion.

FIG. 3 is a chart illustrating an example of what correlation a difference between DC voltages of differential output signals has with a second-order distortion (second harmonic) in the case of using the amplifier circuitry as in FIG. 2. The horizontal axis indicates a difference between the DC voltage of the first amplifier circuitry Amp1 and the DC voltage of the second amplifier circuitry Amp2, and the vertical axis indicates the strength of the second-order distortion.

As illustrated in FIG. 3, it is found that the smaller the difference between the DC voltage of the signal output from the first amplifier circuitry Amp1 and the DC voltage of the signal output from the second amplifier circuitry Amp2 is, the smaller the second-order distortion is. Conversely, the larger the difference between the DC components of the differential signals is, the larger the second-order distortion is.

The second-order distortion occurs, for example, due to the mismatch between elements of the first amplifier circuitry Amp1 and the second amplifier circuitry Amp2.

Hence, in this embodiment, an amplifier circuitry will be explained which decreases the second-order distortion by including a correction circuitry which decreases the difference between the DC components of the signals amplified by the two amplifier circuitries into which the differential signals are input. Note that though the fourth- or higher-order distortion is not particularly described in the above because the fourth- or higher-order distortion is smaller than the second-order distortion, the distortion due to the fourth or higher even-order harmonic can also be similarly suppressed.

Though the harmonic component is difficult to directly detect, the DC components are compared as explained above, and the difference between the DC components is made smaller, thereby making it possible to decrease the influence by the second-order distortion.

Figure 4:
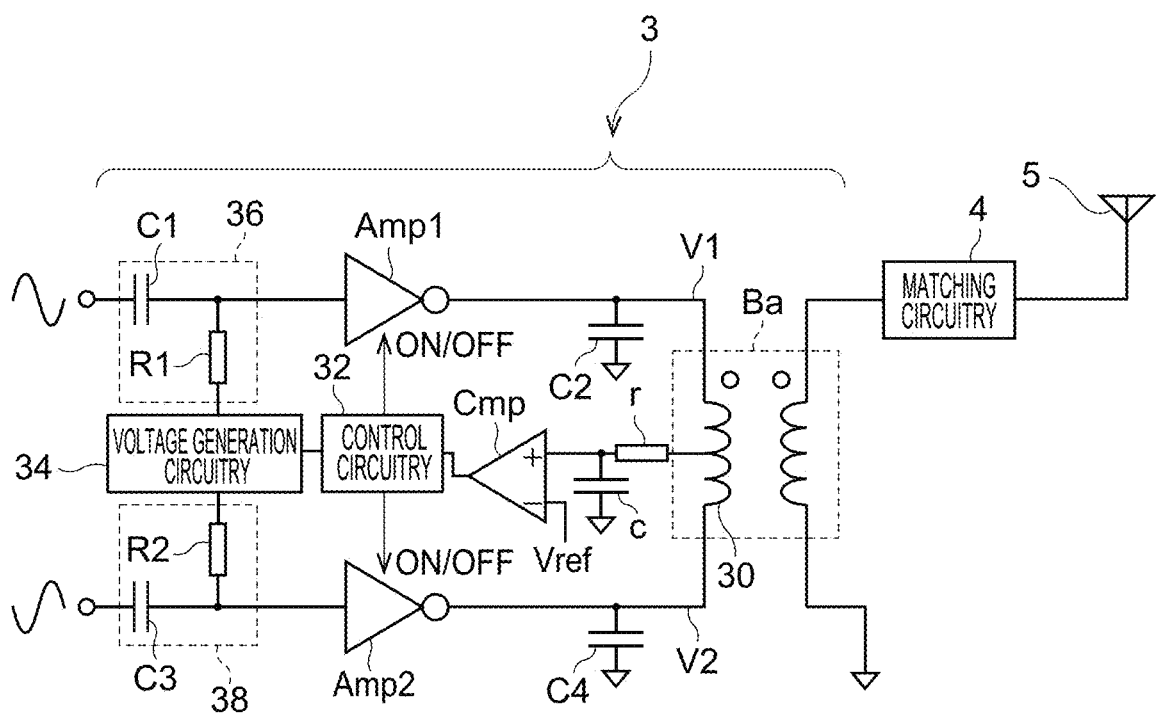
FIG. 4 is a circuitry diagram illustrating an example of an amplifier circuitry according to an embodiment.

FIG. 4 is a circuitry diagram illustrating the outline of the amplifier circuitry 3 according to the embodiment, illustrates important elements as examples, but is not intended to inhibit the provision of a configuration other than the illustrated elements. Further, the power supply voltages, for example, Vss, Vdd are coupled to appropriate elements though not illustrated. For example, to the other elements requiring the power supply voltages such as the first amplifier circuitry Amp1 and so on, conductive wires and so on for appropriately applying Vss, Vdd are coupled.

The amplifier circuitry 3 includes the first amplifier circuitry Amp1, the second amplifier circuitry Amp2, capacitors C2, C4, c, a resistor r, the balun Ba, a comparator circuitry Cmp, a control circuitry 32, a voltage generation circuitry 34, a first bias voltage application circuitry 36, and a second bias voltage application circuitry 38.

When the differential signals are input, the amplifier circuitry 3 amplifies the signals, and combines them into a single-phase signal and outputs the single-phase signal. Hereinafter, one of the differential signals is described as a first signal, and the other is described as a second signal for explanation. In other words, the second signal is a signal reverse in phase to the first signal and forming the differential signals together with the first signal.

First of all, the influence of the first bias voltage application circuitry 36 and the second bias voltage application circuitry 38 are not taken into consideration.

The first amplifier circuitry Amp1 amplifies the first signal and the amplified first signal. This first amplifier circuitry Amp1 is, for example, an amplifier circuitry utilizing an inverter. The first amplifier circuitry Amp1 outputs the amplified first signal to the balun Ba.

The second amplifier circuitry Amp2 amplifies the second signal and the amplified second signal. This second amplifier circuitry Amp2 is, for example, an amplifier circuitry utilizing an inverter. The second amplifier circuitry Amp2 outputs the amplified second signal to the balun Ba.

The amplified first signal output from the first amplifier circuitry Amp1 is matched by the capacitor C2 and then input into the balun Ba. Similarly, the amplified second signal output from the second amplifier circuitry Amp2 is matched by the capacitor C4 and then input into the balun Ba.

The balun Ba includes, for example, differential inductors, and an inductor which receives the signals output from the differential inductors. Hereinafter, the differential inductors are called a combiner circuitry 30. The balun Ba combines the input differential signals and converts them to a single-phase signal and outputs the single-phase signal. The combiner circuitry 30 has two terminals, and the terminals are coupled with the output of the first amplifier circuitry Amp1 and the output of the second amplifier circuitry Amp2, respectively. Since the signals reverse in phase are input from both the terminals, the combiner circuitry 30 generates the difference between the differential signals, and outputs the single-phase signal from the inductor on the reception side based on the generated signal.

The above is the main configuration of the amplifier circuitry 3. Note that the balun Ba performs an operation of synthesizing the signals as explained above and therefore may be included as the matching circuitry 4.

With respect to the above main configuration of the amplifier circuitry 3, a circuitry which decreases the difference between the DC components of the signals output from the two amplifier circuitries as illustrated in FIG. 3 is the correction circuitry. This correction circuitry includes the resistor r, the capacitor c, the comparator circuitry Cmp, the control circuitry 32, the voltage generation circuitry 34, the first bias voltage application circuitry 36, and the second bias voltage application circuitry 38.

The resistor r is coupled to the midpoint of the combiner circuitry 30. The capacitor c couples an output of the resistor r and the ground surface. The resistor r and the capacitor c extract a signal having a high-frequency component grounded, from the signal at the midpoint of the combiner circuitry 30. In other words, the resistor r and the capacitor c operate in combination as a low-pass filter. For example, when the resistor r and the capacitor c are combined, the impedances are set so as to remove the clock frequencies of the differential signals input into the amplifier circuitry 3. By setting the impedances so as to remove the clock frequencies, the low-pass filter operates as a circuitry which extracts a component obtained by removing the high-frequency component due to the clock frequency from the signal at the midpoint of the combiner circuitry 30, namely, the DC component.

The comparator circuitry Cmp has a non-inverting terminal coupled to, for example, an output of the low-pass filter and has an inverting terminal to which a reference voltage Vref being a DC voltage is applied. This comparator circuitry Cmp compares the DC voltage output from the low-pass filter and the reference voltage Vref, amplifies the difference between them, and outputs the amplified difference.

The control circuitry 32 is coupled to the comparator circuitry Cmp. This control circuitry 32 controls a first bias voltage to be applied to the first signal and a second bias voltage to be applied to the second signal, based on the output from the comparator circuitry Cmp. Further, the control circuitry 32 is also coupled to the first amplifier circuitry Amp1 and the second amplifier circuitry Amp2, and controls driving of these amplifier circuitries.

The voltage generation circuitry 34 is coupled to the control circuitry 32. This voltage generation circuitry 34 is controlled by the control circuitry 32, and outputs the first bias voltage to be applied to the first signal and the second bias voltage to be applied to the second signal.

The first bias voltage application circuitry 36 is coupled to the voltage generation circuitry 34 and to the first amplifier circuitry Amp1. The first bias voltage application circuitry 36 includes the capacitor C1 and a resistor R1. The capacitor C1 is coupled between an input terminal into which the first signal is input of the amplifier circuitry 3 and an input of the first amplifier circuitry Amp1. The capacitor C1 extracts the high-frequency component of the first signal. On the other hand, the resistor R1 is coupled between the voltage generation circuitry 34 and the input of the first amplifier circuitry Amp1. This resistor R1 does not allow an AC component output from the capacitor C1 to pass therethrough, but applies the first bias voltage which is the DC voltage output from the voltage generation circuitry 34, to the high-frequency component (AC component) output from the capacitor C1. Thus, the first bias voltage generated by the voltage generation circuitry 34 under control of the control circuitry 32 is applied to the AC component of the first signal.

The second bias voltage application circuitry 38 is coupled to the voltage generation circuitry 34 and to the second amplifier circuitry Amp2. The second bias voltage application circuitry 38 includes the capacitor C3 and a resistor R2. The capacitor C3 is coupled between an input terminal into which the second signal is input of the amplifier circuitry 3 and an input of the second amplifier circuitry Amp2. The capacitor C3 extracts the high-frequency component of the second signal. On the other hand, the resistor R2 is coupled between the voltage generation circuitry 34 and the input of the second amplifier circuitry Amp2. This resistor R2 does not allow an AC component output from the capacitor C3 to pass therethrough, but applies the second bias voltage which is the DC voltage output from the voltage generation circuitry 34, to the high-frequency component (AC component) output from the capacitor C3. Thus, the second bias voltage generated by the voltage generation circuitry 34 under control of the control circuitry 32 is applied to the AC component of the second signal.

The first bias voltage application circuitry 36 and the second bias voltage application circuitry 38 are controlled so that the signals output from the first amplifier circuitry Amp1 and the second amplifier circuitry Amp2 have the reference voltage Vref as their DC components at the midpoint of the combiner circuitry 30.

Hereinafter, how the control circuitry 32 controls the bias voltage will be explained.

Figure 5:
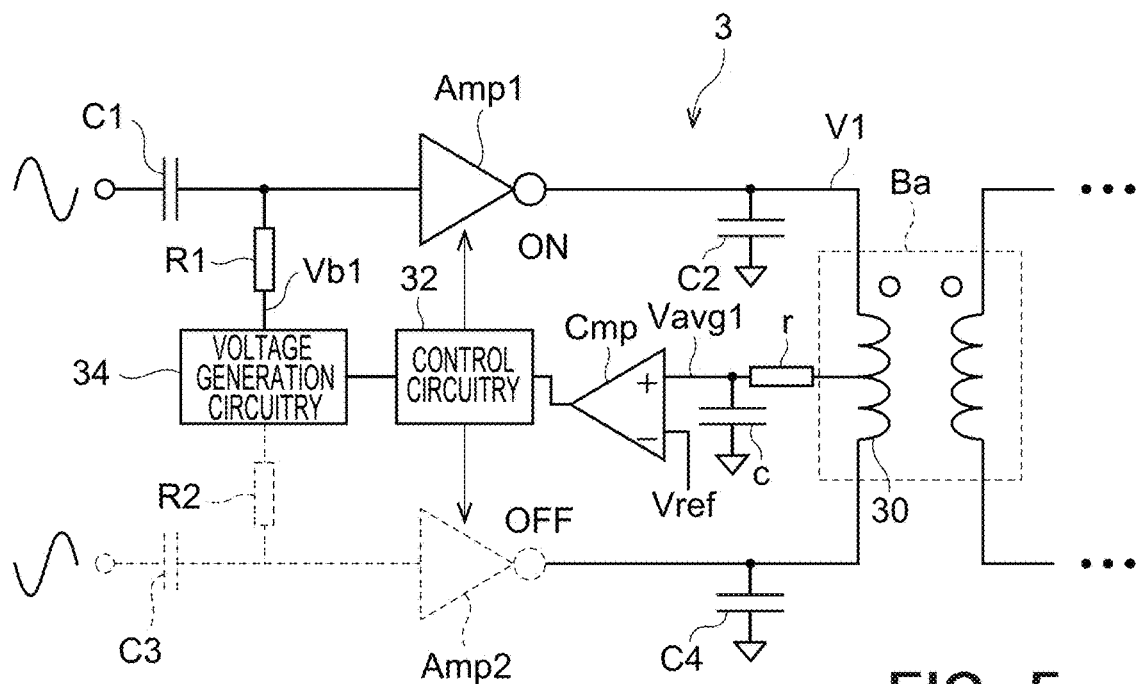
FIG. 5 is a circuitry diagram illustrating an example of an operation of an amplifier circuitry according to an embodiment.

FIG. 5 is a diagram illustrating how to control the first bias voltage. The control circuitry 32 turns ON the first amplifier circuitry Amp1 and turns OFF the second amplifier circuitry Amp2. By this control, the first signal is amplified by the first amplifier circuitry Amp1 and then input into the combiner circuitry 30. On the other hand, the second amplifier circuitry Amp2 is turned OFF, and therefore the signal is not transmitted to the circuitries indicated with broken lines, so that the second signal is not input into the combiner circuitry 30.

Therefore, the DC component at the midpoint of the combiner circuitry 30 is a DC component Vavg1 of the output signal of the first amplifier circuitry Amp1. The DC voltage Vavg1 of the output signal of the first amplifier circuitry Amp1 is input into the non-inverting terminal of the comparator circuitry Cmp.

The comparator circuitry Cmp compares the DC voltage Vavg1 of the output signal of the first amplifier circuitry Amp1 and the reference voltage Vref, and outputs a comparison result to the control circuitry 32. The control circuitry 32 controls the voltage generation circuitry 34 based on the comparison result, and outputs a first bias voltage Vb1 which decreases the difference between the DC voltage Vavg1 of the output signal of the first amplifier circuitry Amp1 and the reference voltage Vref.

When Vavg1>Vref, the control circuitry 32 conducts a control of increasing the first bias voltage to thereby make Vavg1 closer to Vref. On the other hand, when Vavg1<Vref, the control circuitry 32 conducts a control of decreasing the first bias voltage to thereby make Vavg1 closer to Vref. The control circuitry 32 outputs a voltage Vctr for a control of increasing/decreasing the first bias voltage.

The voltage generation circuitry 34 is a circuitry which generates a voltage according to the output of the control circuitry 32 and outputs the voltage. The voltage generation circuitry 34 includes a circuitry which generates the first bias voltage to be applied to the first signal, and a circuitry which generates the second bias voltage to be applied to the second signal.

Figure 6:
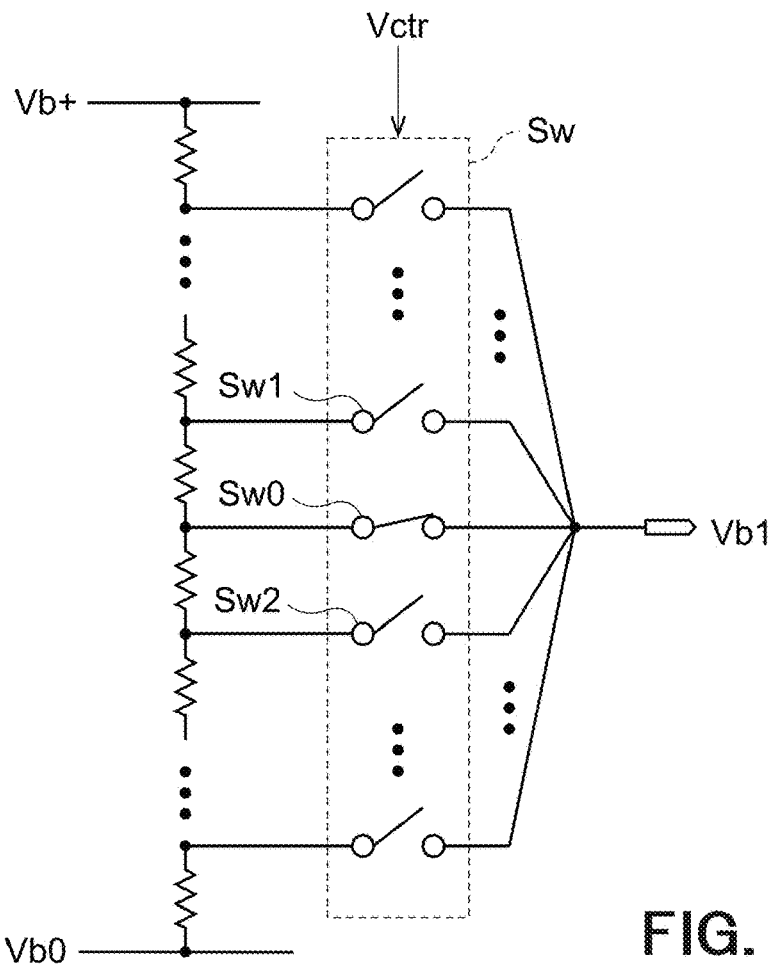
FIG. 6 is a circuitry diagram illustrating an example of a voltage generation circuitry according to an embodiment.

FIG. 6 illustrates an example of the circuitry which generates the first bias voltage Vb1 in the voltage generation circuitry 34. The voltage generation circuitry 34 includes, for example, a plurality of resistors and a switch Sw. The voltage generation circuitry 34 outputs the first bias voltage Vb1 based on the signal Vctr output from the control circuitry 32.

The plurality of resistors are provided between power supply voltages. The switch Sw includes a plurality of individual switches Sw0, Sw1, Sw2, . . . coupled between nodes between the resistors, and, output terminals. The nodes between the resistors are coupled to the output terminals via the individual switches, respectively. The switch Sw turns, for example, one individual switch ON and turns the other switches OFF, based on the output of the control circuitry 32. It is assumed that, for example, the switch Sw0 is ON and the other switches are OFF. In this case, when Vavg1<Vref, the control signal of decreasing the first bias voltage Vb1 is output from the control circuitry 32. The control circuitry 32 may be composed of, for example, a logic circuitry, and may output the control signal Vctr depending on whether the output of the comparator circuitry Cmp is a positive voltage or a negative voltage. In this case, in order to decrease the first bias voltage Vb1 based on the output of the control circuitry 32, the voltage generation circuitry 34 turns the switch Sw2 ON and turns the switch Sw0 OFF. In this manner, the voltage generation circuitry 34 decreases the voltage to be output. During continuation of the input of the control signal of decreasing the output voltage from the control circuitry 32, the voltage generation circuitry 34 continues to switch the individual switches one after another so as to decrease the output voltage.

On the other hand, when Vavg1>Vref, the control signal of increasing the first bias voltage Vb1 is output from the control circuitry 32. In this case, the switch operation reverse to the above is executed. For example, it is assumed that, for example, the switch Sw0 has been coupled, the switch Sw1 is turned ON and the switch Sw0 is turned OFF. During the time when the control signal of decreasing the output voltage is output from the control circuitry 32, the above operation is repeated.

Note that the switching operation may be performed at predetermined timing with respect to the output from the control circuitry 32. By performing the switching operation at each predetermined timing, a control may be conducted such that the next switch operation is not performed until the influence by the signal reflecting the bias voltage due to the switching of the switch arrives at the control circuitry 32.

Upon receipt of the output of the comparator circuitry Cmp, the control circuitry 32 outputs the control signal of decreasing the first bias voltage Vb1 during output of the state of Vavg1<Vref. The comparator circuitry Cmp amplifies the difference between Vavg1 and Vref and output the amplified difference, and may output a signal indicating Vavg1=Vref when the absolute value of the difference is a sufficiently small predetermined value or less. This can avoid the switch from being continued to be switched.

More specifically, a predetermined voltage ΔV is defined in advance, and when |Vavg1−Vref|<ΔV, the control circuitry 32 does not need to output the control signal, or may output a control signal of not switching the switch. Defining the ΔV can avoid repetition of increasing and decreasing the bias voltage in a state close to Vavg1=Vref. More specifically, for example, when Vavg1>Vref in a state where the switch Sw0 is ON and Vavg1<Vref in a state where the switch Sw1 is ON, the switch Sw continues switching between the state where the switch Sw0 is ON and the state where the switch Sw1 is ON. However, defining the ΔV can avoid the above state.

The above serial state transition brings the reference voltage Vref and the DC component Vavg1 of the output signal of the first amplifier circuitry Amp1 into substantially the same state. The similar operation is executed also to a DC component Vavg2 of the output signal of the second amplifier circuitry Amp2.

The first bias voltage Vb1 output from the voltage generation circuitry 34 is applied to the first signal via the resistor R1 having a resistance value large enough to block the frequency of the input signal. As a result, the first bias voltage Vb1 can be applied to the first signal from which the AC component has been extracted in the capacitor C1. As a result, the output signal of the first amplifier circuitry Amp1 is input into the combiner circuitry 30.

Figure 7:
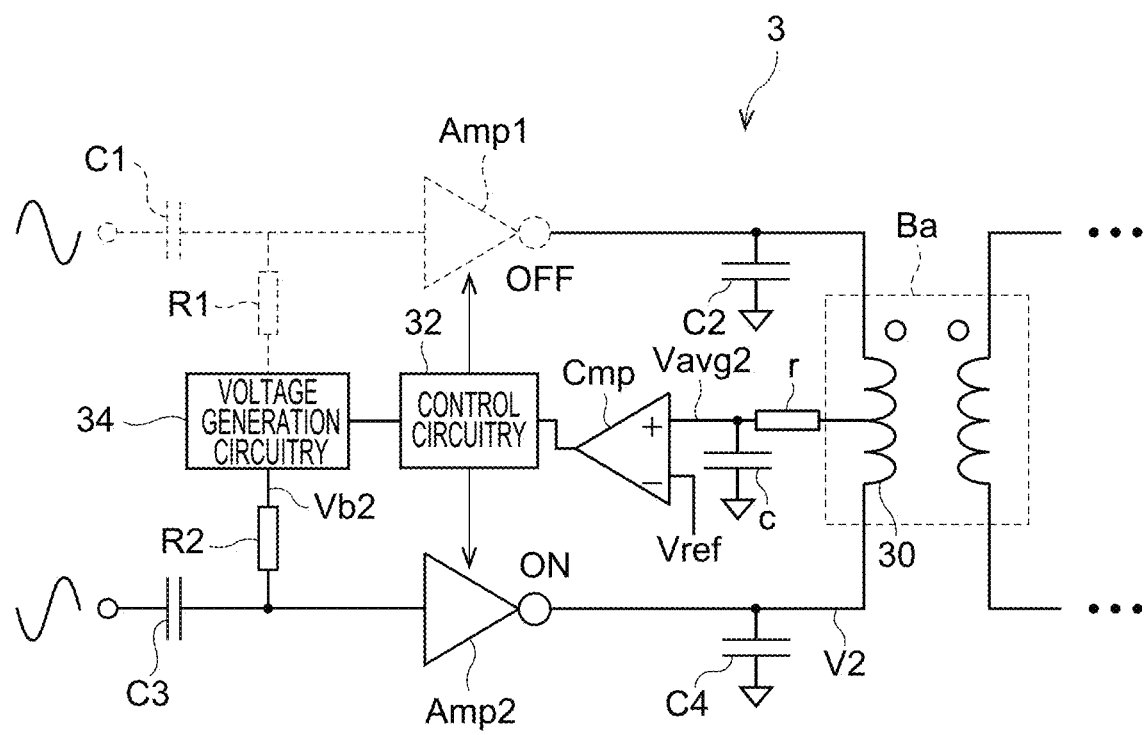
FIG. 7 is a circuitry diagram illustrating an example of an operation of an amplifier circuitry according to an embodiment.

FIG. 7 is a diagram illustrating how to control the second bias voltage. The control circuitry 32 turns ON the second amplifier circuitry Amp2 and turns OFF the first amplifier circuitry Amp1. By this control, the output signal of the second amplifier circuitry Amp2 is input into the combiner circuitry 30. On the other hand, the first amplifier circuitry Amp1 is turned OFF, and therefore the signal is not transmitted to the circuitries indicated with broken lines, so that the first signal is not input into the combiner circuitry 30.

In the state of FIG. 7, the same operations as those explained in FIG. 5 and FIG. 6 are executed to conduct a control so that the DC component Vavg2 of the output signal of the second amplifier circuitry Amp2 and the reference voltage Vref are equal voltages. By the control of the control circuitry 32, a second bias voltage Vb2 is similarly applied to the AC component of the second signal, and as a result, the output signal of the second amplifier circuitry Amp2 is input into the combiner circuitry 30.

Note that the voltage generation circuitry 34 separately includes the circtuitry which generates the first bias voltage Vb1 and the circtuitry which generates the second bias voltage Vb2 as explained above. For example, the first bias voltage Vb1 is adjusted according to FIG. 5, thereafter the state of the switch is fixed, then the second bias voltage Vb2 is adjusted, and thereafter the state of the switch is fixed. Thereafter, the control circuitry 32 conducts a control of driving both of the first amplifier circuitry Amp1 and the second amplifier circuitry Amp2, and shifts to a signal transmission mode.

The above generation of the bias voltage is illustrated as an example, and does not limit the control of the bias voltage. For example, the control circuitry 32 is the logic circuitry in the above, but may be a circuitry which outputs an appropriate bias voltage by changing a variable resistance value included in the voltage generation circuitry 34 to an appropriate value according to the magnitude of the output from the comparator circuitry Cmp or by appropriately changing an output impedance of the voltage generation circuitry 34.

When both of the amplifier circuitries are turned ON, the differential signals suppressed in influence of a mismatch between the elements of the individual amplifier circuitries are input into the combiner circuitry 30. The combiner circuitry 30 combines the amplified differential signals and outputs a single-phase signal, as the balun Ba. Then, the single-phase signal is output from the transmitter 1 via the matching circuitry 4 and the antenna 5.

As explained above, this embodiment makes it possible to suppress the mismatch between signals due to the mismatch between the elements of the amplifier circuitries which amplify the respective differential signals. The use of the same comparator circuitry when generating the bias voltages to be applied to the signals can also avoid the characteristics of the comparator circuitry from affecting the bias voltages.

The amplifier circuitry according to an embodiment can be used, for example, for a transmitter for low power consumption. The amplifier circuitry can be used, for example, for a device using Bluetooth (registered trademark), RF (Radio Frequency) of a mobile or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. An amplifier circuitry comprising:
   a first amplifier circuitry configured to amplify a first signal;
   a second amplifier circuitry configured to amplify a second signal which forms differential signals together with the first signal;
   a voltage generating circuitry configured to generate at least one of a first bias voltage to be applied to the first signal and a second bias voltage to be applied to the second signal; and
   a control circuitry configured to control the voltage generation circuitry so as to decrease a difference between a DC component of an output of the first amplifier circuitry and a DC component of an output of the second amplifier circuitry.
2. The amplifier circuitry according to claim 1, further comprising:
   a combiner circuitry configured to combine the amplified first signal and the amplified second signal; and
   a comparator circuitry configured to compare a voltage at a midpoint of the combiner circuitry and a reference voltage, wherein
   the control circuitry controls, based on an output of the comparator circuitry, at least one of the first bias voltage and the second bias voltage.
3. The amplifier circuitry according to claim 2, wherein
   the control circuitry further conducts control signals to decide the ON/OFF state of the first amplifier and the second amplifier, respectively.

4. The amplifier circuitry according to claim 3, wherein:
the control circuitry compares a DC component of the voltage at the midpoint of the combiner circuitry and the reference voltage; and
the control circuitry further controls, based on the output of the comparator circuitry:
  in the state where the first amplifier circuitry is turned ON and the second amplifier circuitry is turned OFF, the first bias voltage so that a difference between a DC component of a voltage of an output signal of the first amplifier circuitry amplified by the first amplifier circuitry and the reference voltage is smaller than in a case where the first bias voltage is not controlled; and
  in the state where the first amplifier circuitry is turned OFF and the second amplifier circuitry is turned ON, the second bias voltage so that a difference between a DC component of a voltage of an output signal of the second amplifier circuitry amplified by the second amplifier circuitry and the reference voltage is smaller than in a case where the second bias voltage is not controlled.

* * * * *